United States Patent
Fukuta et al.

(10) Patent No.: US 9,419,604 B2
(45) Date of Patent: Aug. 16, 2016

(54) DRIVING SYSTEM FOR SWITCHING ELEMENT

(71) Applicant: DENSO CORPORATION, Kariya, Aichi-pref. (JP)

(72) Inventors: Junichi Fukuta, Kuwana (JP); Tsuneo Maebara, Nagoya (JP)

(73) Assignee: DENSO CORPORATION, Kariya (JP)

(*) Notice: Subject to any disclaimer, the term of this patent is extended or adjusted under 35 U.S.C. 154(b) by 422 days.

(21) Appl. No.: 13/901,222

(22) Filed: May 23, 2013

(65) Prior Publication Data

US 2013/0314132 A1 Nov. 28, 2013

(30) Foreign Application Priority Data

May 24, 2012 (JP) ................................. 2012-118281

(51) Int. Cl.
| | | |
|---|---|---|
| *G01K 7/00* | (2006.01) | |
| *G05D 23/275* | (2006.01) | |
| *H03K 17/18* | (2006.01) | |
| *H03K 17/08* | (2006.01) | |

(52) U.S. Cl.
CPC ........ *H03K 17/18* (2013.01); *H03K 2017/0806* (2013.01)

(58) Field of Classification Search
CPC combination set(s) only.
See application file for complete search history.

(56) References Cited

U.S. PATENT DOCUMENTS

| 8,680,896 | B2 * | 3/2014 | Fukuta | H02M 1/08 327/108 |
| 2007/0200515 | A1 * | 8/2007 | Misumi | H02P 27/08 318/400.29 |
| 2011/0278918 | A1 * | 11/2011 | Shindo | B60L 3/0007 307/9.1 |
| 2012/0146613 | A1 * | 6/2012 | Hamanaka | H03K 17/567 323/311 |
| 2012/0217937 | A1 * | 8/2012 | Miyauchi | H03K 17/18 322/28 |
| 2012/0249020 | A1 * | 10/2012 | Komatsu | H03K 17/08128 318/139 |

FOREIGN PATENT DOCUMENTS

| JP | 2007-195343 | 8/2007 |
| JP | 2007-252109 | 9/2007 |
| JP | 4844292 | 10/2011 |

* cited by examiner

*Primary Examiner* — Lisa Caputo
*Assistant Examiner* — Nasir U Ahmed
(74) *Attorney, Agent, or Firm* — Nixon & Vanderhye P.C.

(57) ABSTRACT

In a driving system for driving a switching element, a controller controls the switching element. A temperature measuring module measures a temperature of the switching element, and output a first signal representing the measured temperature of the switching element as first information. A state determining module determines whether the switching element is in a specified temperature state based on the first signal, and outputs a second signal representing a result of the determination as second information. A communication medium communicably connects between the controller and the state determining module, and the second signal output from the state determining module being transferred to the controller via the communication medium. The controller determines how to drive the switching element based on the second information in the second signal transferred thereto via the communication medium.

14 Claims, 7 Drawing Sheets

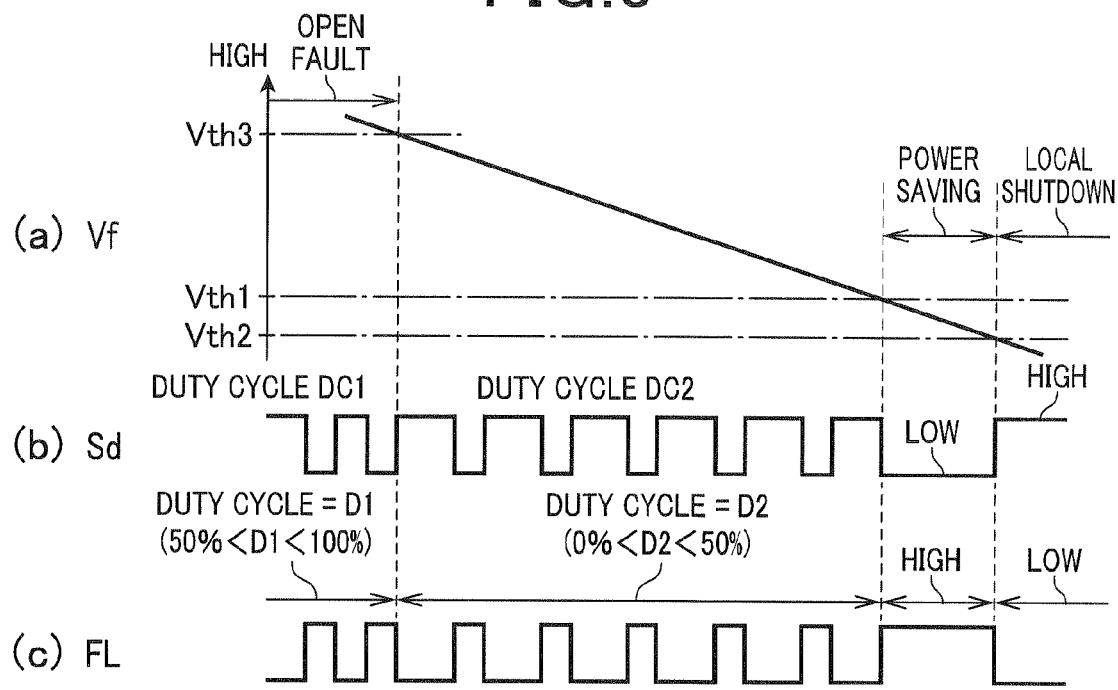
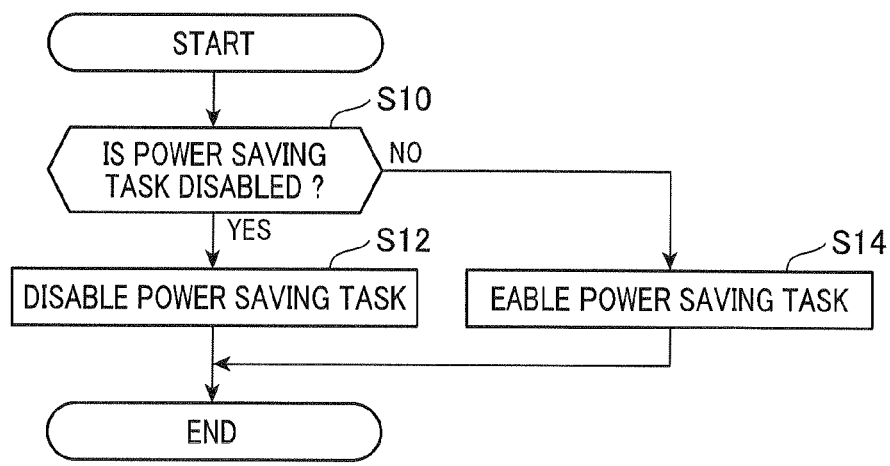

DRIVING SYSTEM FOR SWITCHING ELEMENT

CROSS REFERENCE TO RELATED APPLICATIONS

This application is based on and claims the benefit of priority from Japanese Patent Application 2012-118281 filed on May 24, 2012, the disclosure of which is incorporated in its entirety herein by reference.

TECHNICAL FIELD

The present disclosure relates to driving systems for a switching element, more particularly, to such driving systems having a function of measuring the temperature of a switching element.

BACKGROUND

Switching elements, such as IGBTs, MOSFETs, and so on, are commonly used for turn-on and turn-off of devices, power conversion, and the like. Such switching elements are sensitive in their reliability to their temperatures, so drive of these switching element should be preferably controlled based on their temperatures.

In view of these circumstances, Japanese Patent Application Publication No. 2009-171312 is known, which discloses a system in which IGBTs as an example of switching elements are provided to convert inputted DC power into AC power, and the AC power is supplied to a high-power load, such as a motor-generator. Turn-on or turn-off of each of the IGBTs is controlled by a microcomputer installed in the known system. In the known system, because of the high-power load, a high-voltage system including the high-power load and the IGBTs and a low-voltage system including the microcomputer are separated from each other, and the high- and low-voltage systems are communicably coupled with each other via communication media. Particularly, in the known system, photocouplers are used as the communication media, so that electrical insulation is established between the high- and low-voltage systems while communications can be maintained therebetween.

The known system is designed such that information about temperature of each IGBT of the high-voltage system is transferred to the microcomputer of the low-voltage system via a corresponding photocoupler.

Specifically, the first voltage system is equipped with a temperature-sensitive diode and a frequency modulator for each IGBT. The temperature-sensitive diode measures a temperature value of a corresponding IGBT, and sends, to the frequency modulator, an output signal indicative of the measured temperature value of the corresponding IGBT. The frequency modulator frequency-modulates the output signal from the temperature-sensitive diode, and sends the frequency-modulated signal to a corresponding photocoupler. The photocoupler converts the frequency-modulated signal into light, returns the light to an electric output signal corresponding to the frequency-modulated signal, and sends the output signal to the microcomputer. The microcomputer receives the output signal sent from the photocoupler, and calculates a temperature value of the corresponding IGBT based on the received output signal.

If it determines that the calculated temperature value of an IGBT exceeds a preset threshold value, the microcomputer determines that the IGBT is in a specified temperature state, so that drive of the IGBT should be limited. Then, the microcomputer performs a task to limit drive of the IGBT. This task limits a collector current from flowing as an output current through the IGBT, thus avoiding the reduction in the reliability of the IGBT due to its overheating.

SUMMARY

The inventors of this application have found that error components may be contained in the output signal transferred to the microcomputer from a photocoupler corresponding to at least one IGBT. These error components may result from, for example, transfer delay in the output signal via a photocoupler corresponding to the at least one IGBT, and the difference between the actual temperature value of the at least one IGBT and the measured temperature value of the at least one IGBT. An increase in the magnitude of the error components contained in the output signal transferred from a photocoupler corresponding to at least one IGBT may reduce the microcomputer's calculation accuracy of the temperature value of the at least one IGBT. This may result in reduction of the accuracy of determining whether drive of the at least one IGBT should be limited.

Accordingly, these error components may result in reduction of the accuracy of determining whether one or more IGBTs are in a specified temperature state.

In view of the circumstances set forth above, one aspect of the present disclosure seeks to provide driving systems for a switching element, which are designed to solve the problems set forth above.

Specifically, an alternative aspect of the present disclosure aims to provide such driving systems, which are capable of increasing the accuracy of determining whether the switching element is in a specified temperature state.

According to an exemplary aspect of the present disclosure, there is provided a driving system for driving a switching element. The driving system includes a controller configured to control the switching element, and a temperature measuring module configured to measure a temperature of the switching element, and output a first signal representing the measured temperature of the switching element. The driving system includes a state determining module configured to: determine whether the switching element is in a specified temperature state based on the first signal, and output a second signal representing a result of the determination. The driving system includes a communication medium that communicably connects between the controller and the state determining module, the second signal output from the state determining module being transferred to the controller via the communication medium. The controller is configured to determine how to drive the switching element based on the second signal transferred thereto via the communication medium.

In the exemplary aspect of the present disclosure, whether the switching element is in the specified temperature state based on the first signal representing the measured temperature of the switching element is determined by the state determiner. The result of the determination is output, as the second signal, from the state determiner to be transferred via the communication medium to the controller.

Specifically, the determination of whether the switching element is in the specified temperature state is performed without involving the controller, i.e. without transfer of the first signal including the measured temperature of the switching element via the communication medium. Thus, it is possible to reduce the possibility of error components due to information transfer through the communication medium affecting on the determination, in other words, containing in the measured temperature of the switching element. This makes it possible to improve the accuracy of determining whether to drive the switching element based on the second signal in comparison to the known system in which measured temperature information is transferred via the photocoupler to the microcomputer.

The above and/or other features, and/or advantages of various aspects of the present disclosure will be further appreciated in view of the following description in conjunction with the accompanying drawings. Various aspects of the present disclosure can include or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 8 is a timing chart schematically illustrating the correlation between an output voltage of a target temperature-sensitive diode and a variable-duty signal output from a determining module illustrated in FIG. 7; and FIG. 9 is a flowchart schematically illustrating an example of specific steps of a power-saving disabling task carried out by a controller according to a fourth embodiment of the present disclosure.

DETAILED DESCRIPTION OF EMBODIMENT

Figure 1:
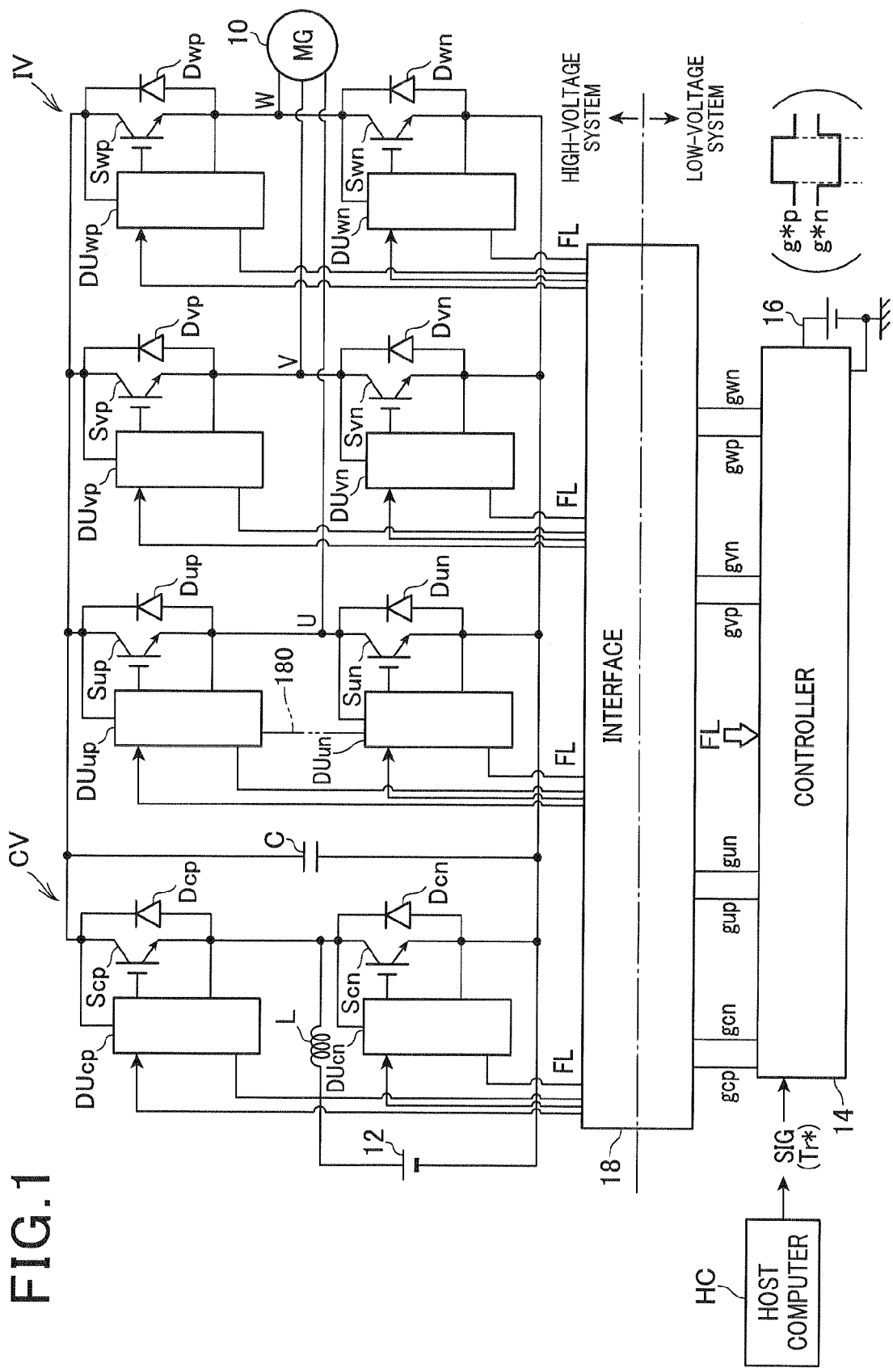
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified to avoid redundant description.

First Embodiment

Referring to FIG. 1, there is illustrated a three-phase motor-generator as an example of rotating machines, referred to simply as a "motor-generator" 10, installed in, for example, a hybrid vehicle as a main engine according to the first embodiment. The motor-generator 10 is mechanically coupled to driving wheels (not shown) of the motor vehicle.

For example, as the motor-generator 10, a brushless DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter IV, a converter CV as an example of DC power sources, a high-voltage battery 12, drive units DU*# (*=c, u, v, w, #=p, n), temperature-sensitive sensors SD*# (*=c, u, v, w, #=p, n) (see FIG. 2), capacitors Ca, a controller 14, a low-voltage battery 16, and an interface 18.

To the motor-generator 10, the high-voltage battery 12 is electrically connected via the inverter IV and the converter CV. The high-voltage battery 12 has a terminal voltage of, for example, 288 V thereacross.

The converter CV includes a capacitor C, a pair of series-connected switching elements Scp and Scn, a pair of flywheel diodes Dcp and Dcn, and a reactor L. The capacitor C is connected in parallel to the inverter IV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to the positive terminal of the high-voltage battery 12, and the other end thereof is connected to the connection point between the switching elements Scp and Scn. One end of the series-connected switching elements Scp and Scn of the converter CV is connected to the positive DC input line of the inverter IV, and the other end thereof is connected to the negative DC input line of the inverter IV. The negative DC input line of the inverter IV is connected to the negative terminal of the battery 12.

The converter CV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CV is set to a predetermined high voltage, such as 666 V.

The inverter IV is designed as a three-phase inverter. The inverter IV is provided with three pairs of series-connected high- and low-side (upper- and lower-arm) switching elements Sup and Sun, Svp and Svn, and Swp and Swn. The inverter IV is also provided with flywheel diodes D*# (*=u, v, w, #=p, n) electrically connected in antiparallel to the corresponding switching elements S*# (*=u, v, w, #=p, n), respectively.

In this embodiment, as the switching elements S*# (*=u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p (*=u, v, w) is connected to a corresponding one of the elements S*n (*=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

The temperature-sensitive sensors SD*# are located to be close to the respective switching elements S*#, and operative to measure the temperatures of the respective switching elements S*#. The capacitors Ca are connected in parallel to the respective temperature-sensitive sensors SD*#. Operations of the temperature-sensitive sensors SD*# and the capacitors Ca will be described in detail later.

For example, the controller 14 operates on a power-supply voltage, lower than the terminal voltage across the high-voltage battery 12, supplied from the low-voltage battery 16. Thus, the controller 14 and the low-voltage battery 16 constitute a low voltage system. In contrast, the motor-generator 10, the converter CV, the inverter IV, the drive units DU*#, the temperature-sensitive sensors SD*#, the capacitors Ca, and the high-voltage battery 12 constitute a high voltage system.

The interface 18 serves as a communication medium configured to enable communications between the high and low voltage systems while establishing electrical insulation therebetween. Specifically, the interface 18 is configured to enable the controller 14 to control each of the switching elements S*# while establishing electrical insulation between the controller 14 and a corresponding one of the switching elements S*#.

To the controller 14, a host computer HC is communicably connected. The host computer HC is operative to sent external signals SIG including a request torque Tr* for output torque of the motor-generator 10 as a controlled variable thereof. That is, the motor-generator 10 is responsible for generating the request torque Tr* as a part of the request value of torque for the hybrid vehicle, which is input by driver's operation of an accelerator operating member, i.e. accelerator pedal, installed in the hybrid vehicle.

The controller 14 is designed to individually drive the inverter IV and the converter CV to thereby control controlled variables of the motor-generator 10 based on the request torque Tr*. The controller 14 is designed to individually drive the inverter IV and the converter CV to thereby adjust a value of the output torque of the motor-generator 10 to the request torque Tr*.

Specifically, the controller 14 is designed to individually send drive signals gcp and gcn to the drive units DU provided for the respective switching elements Scp and Scn, thus individually turning on or off the respective switching elements Scp and Scn. The controller 14 is also designed to individually send drive signals gup, gun, gvp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or turn-off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a duty cycle, i.e. a predetermined ratio of on duration to the total duration of each switching cycle for a corresponding one of the switching elements S*# (see FIG. 1); the duty cycle of each of the drive signals g*# is determined to adjust a value of the output torque of the motor-generator 10 to the request torque Tr*. The drive signals g*p and g*n for each leg (phase) complementarily change between an on state and an off state (see FIG. 1).

Specifically, the controller 14 is designed to complementarily turn on the high- and low-side switching elements S*# for each leg (phase) via the corresponding drive units DU*# according to the corresponding drive signals g*#. In other words, the controller 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

Figure 2:
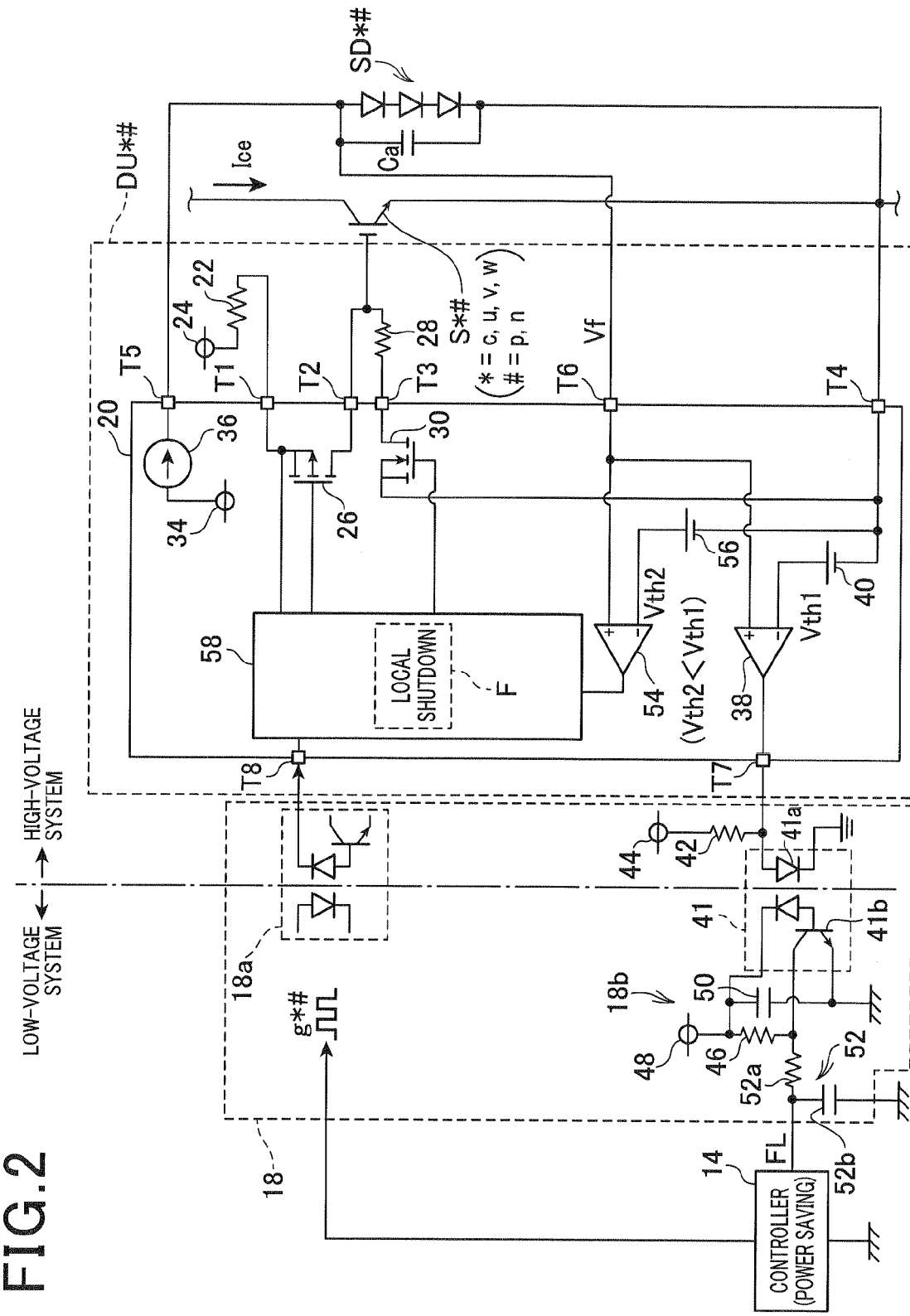
FIG. 2 is a circuit diagram schematically illustrating an example of the structures of a drive unit and an interface of the control system illustrated in FIG. 1.

Next, an example of the circuit structure of each drive unit DU*# provided for a corresponding one switching element S*# will be described with reference to FIG. 2. Note that, in FIG. 2, a circuit of the interface 18, which serves as a module that transfers signals from the high-voltage system to the low-voltage system, is mainly illustrated to avoid complexity. In FIG. 2, a corresponding flywheel diode D*# is omitted in illustration to avoid complexity.

Referring to FIG. 2, the drive unit DU*# is comprised of a drive IC 20 on a chip, a charging resistor 22, a constant voltage source 24, and a discharging resistor 28.

The drive IC 20 has terminals T1 to T8, a charging switching element (SW) 26, a discharge switching element (SW) 30, a constant voltage source 34, and a constant current source 36. The drive IC 20 also has a first comparator 38, a first power supply source 40, a second comparator 54, a second power supply source 54, and a drive controller 58. As the charging switching element 26, a P-channel MOSFET is used, and as the discharging switching element 30, an N-channel MOSFET is used.

The constant voltage source 24 having a terminal voltage of, for example, 15 V thereacross is connected to the terminal T1 via the charging resistor 22. The terminal T1 is connected to the terminal T2 via the charging switching element 24. The terminal T2 is connected to the on-off control terminal, i.e. the gate, of the switching element S*#. That is, the source of the charging switching element 26 is connected to the terminal T1, the drain of the charging switching element 26 is connected to the terminal T2, and the gate thereof is connected to the drive controller 58. The constant voltage source 24 has a function of applying the terminal voltage to the gate of the switching element S*# via the charging resistor 22, the charging switching element 26, and the terminals T1 and T2.

The gate of the switching element S*# is connected to the terminal T3 via the discharging resistor 28. The drain of the discharging switching element 30 is connected to the terminal T3, the source of the discharging switching element 30 is connected to the terminal T4, and the gate thereof is connected to the drive controller 58. The terminal T4 is connected to the output terminal, i.e. the emitter, of the switching element S*# via a common reference-potential line. In this embodiment, the potential at the emitter of the switching element S*# is set to 0 V.

As described above, the temperature-sensitive diode SD*# is located close to the switching element S*#. For example, as illustrated in FIG. 2, a plurality of, for example, first to third diodes are connected in series to form the temperature-sensitive diode SD*#. One end of the temperature-sensitive diode SD*# corresponding to the cathode of the first diode is connected to the emitter of the switching element S*# and the terminal T4, and the other end thereof corresponding to the anode of the third diode is connected to the constant current source 36 via the terminal T5. The capacitor Ca is connected across the temperature-sensitive sensor SD*#.

The connection relation between the temperature-sensitive diode SD*# and the drive IC 20 causes a constant current output from the constant current source 36 to be supplied to the temperature-sensitive diode SD*#. Because each of the diodes constituting the temperature-sensitive diode SD*# is sensitive to temperature therearound, a forward voltage Vf across the temperature-sensitive diode SD*# while the constant current continuously flows therethrough varies depending on the variation in the temperature of the switching element S*#. The forward voltage Vf of the temperature-sensitive diode SD*# is input to the drive IC 20 via the terminal T6 as an output voltage Vf of the temperature-sensitive diode SD*#. The capacitor Ca is operative to eliminate noise components and keep the forward voltage Vf to be stable.

Note that, as the temperature of the temperature-sensitive diode SD*# increases, the forward voltage Vf decreases. The signal of the output voltage Vf output from the temperature-sensitive diode SD*# is an analog voltage signal that continuously varies depending on the variation in the temperature thereof.

The terminal T6 is connected to a non-inverting input terminal of the first comparator 38. To an inverting input terminal of the first comparator 38, the positive terminal of the first power supply source 40 having a first terminal voltage thereacross is connected; the first terminal voltage will be referred to as a first threshold voltage Vth1. The negative terminal of the first power supply source 40 is connected to the terminal T4.

Note that, in the first embodiment, an upper limit, such as 120° C., of the temperature of each switching element S*# at which the switching element S*# can be driven without a power saving task described later is defined as a first threshold temperature Tth1. The first threshold voltage Vth1 is set to a central voltage value, i.e. a representative voltage value, defined for the output voltage Vf of each temperature-sensitive diode SD*# when the actual temperature of a corresponding switching element S*# is maintained at the first threshold temperature Tth1.

The central voltage value is an average value of the output voltages of mass-produced temperature-sensitive diodes including the temperature-sensitive diodes SD*# while the same constant current output from the constant current source 36 continuously flows through each of the mass-produced temperature-sensitive diodes when the actual temperature of a corresponding switching element S*# is maintained at the first threshold temperature Tth1. There may be a variation in the temperature-voltage characteristics of the temperature-sensitive diodes SD*#; the variation may cause a variation in the output voltages of the temperature-sensitive diodes SD*# while the same constant current flows therethrough even if the actual temperature of each of the switching elements S*# is maintained at the first threshold temperature Tth1. For this reason, the central voltage value is defined as a parameter to obtain the individual temperature-voltage characteristics of the respective temperature-sensitive diodes SD*#.

An output terminal of the first comparator 38 is connected to the interface 18 via the terminal T7. For example, the first comparator 38 serves as an open-collector comparator. Specifically, the first comparator 38 is configured such that:

its output goes to high impedance if the output voltage Vf of the temperature-sensitive diode SD*# inputted to the non-inverting terminal of the first comparator 38 is higher than the first terminal voltage Vth1 inputted to the inverting input terminal thereof; and its output goes to low impedance if the output voltage Vf of the temperature-sensitive diode SD*# inputted to the non-inverting terminal of the first comparator 38 is equal to or lower than the first terminal voltage Vth1 inputted to the inverting input terminal thereof.

Referring to FIG. 2, the interface 18 is provided with insulation members, such as photocouplers 18a provided for the respective switching elements S*# of the inverter IV and converter CV. Each of the photocouplers 18a is operative to transmit the drive signal g*# output from the controller 14 for a corresponding one of the switching elements S*# to the drive IC 20 while electrically insulating between the controller 14 and a corresponding one of the switching elements S*#.

The interface 18 is also provided with a temperature-information sending unit 18b. For example, the temperature-information sending unit 18b is provided for any one of the switching elements S*# of the inverter IV and converter CV. Specifically, in the first embodiment, the first comparator 38, the first power supply source 40, and the temperature-information sending unit 18b are provided for one of the switching elements S*#, the temperature of which is assumed to increase to the highest level in the temperatures of all the switching elements S*#. Note that why the temperatures of the respective switching elements are different from each other is that where the switching elements S*# and fluids for cooling them are arranged in the inverter IV and converter CV have an effect on the temperatures of the respective switching elements S*#.

Hereinafter, one of the switching elements S*#, the temperature of which is assumed to increase to the highest level in the temperatures of all the switching elements S*#, will be referred to as a target switching element S*#, and a temperature-sensitive diode SD*# corresponding to the target switching element S*# will be referred to as a target temperature-sensitive diode SD*#.

The temperature-information sending unit 18b is comprised of a photocoupler 41, a resistor 42, a constant voltage source 44, a resistor 46, a constant voltage source 48, a capacitor 50, and a low-pass filter 52.

The photocoupler 41 is comprised of a photodiode 41a as its primary side and a phototransistor 41b as its secondary side. The anode of the photodiode 41a is connected to the output terminal of the first comparator 38 via the terminal T7 and to the constant-voltage source 44 via the resistor 42, and the cathode of the photodiode 41a is grounded. The constant voltage source 44 has a terminal voltage, and outputs a high-voltage signal defined as a logical high level.

If the output of the first comparator 38 has the high potential, the high-voltage signal is output through the photodiode 41a as the output of the first comparator 38, so that light is emitted from the photodiode 41a. Otherwise, if the output of the first comparator 38 has the low potential, a low-voltage signal is output from the first comparator 38, so that light from the photodiode 41a is shut off.

That is, a signal representing binary information about the logical high or low level is input to the interface 18.

In FIG. 2, an equivalent circuit diagram of the phototransistor 41b is illustrated. Specifically, the PN junction as the collector-base diode of the phototransistor 41b is reversely biased by the constant-voltage source 48. If the light emitted from the photodiode 41a is irradiated to the PN junction of the phototransistor 41b, a collector current depending on the intensity of the irradiated light is generated so that the phototransistor 41b is turned on.

A connection point between the constant-voltage source 48 and one end of the resistor 46 is grounded via the capacitor 50. The collector of the phototransistor 41b is connected to the other end of the resistor 48, so that it is connected to the constant-voltage source 48 via the resistor 46. The emitter of the phototransistor 41b is grounded. The connection point between the collector of the phototransistor 41b and the other end of the resistor 46 is connected to the controller 14 via the low-pass filter 52 comprised of a resistor 52a and a capacitor 52b. That is, the connection point between the collector of the phototransistor 41b and the other end of the resistor 46 serves as the input terminal of the low-pass filter 52. An output terminal of the low-pass filter 52 is connected to the controller 14, so that an output signal of the low-pass filter 52 is input to the controller 14 as a fail-safe signal FL.

The fail-safe signal FL has one of a logical high level and a logical low level. How the fail-safe signal FL is supplied to the controller 14 will be described later.

The terminal T6 is also connected to a non-inverting input terminal of the second comparator 54. To an inverting input terminal of the second comparator 54, the positive terminal of the second power supply source 56 having a second terminal voltage thereacross is connected; the second terminal voltage, which will be referred to as a second threshold voltage Vth2, is set to be lower than the first terminal voltage, i.e. the first threshold voltage Vth1, of the first power supply source 40. The negative terminal of the second power supply source 56 is connected to the terminal T4.

Note that, in the first embodiment, a lower limit, such as 170° C. or thereabout, of the temperature of each switching element S*# is defined as a second threshold temperature Tth2 higher than the first threshold temperature Tth1. The second threshold temperature Tth2 means that, if the actual temperature of a switching element S*# were higher than the second threshold temperature Tth2, the reliability of the switching element S*# would be reduced in a short period. In other words, the reliability of a switching element S*# would be maintained based on the power saving task described later unless the actual temperature of the switching element S*# were higher than the second threshold temperature Tth2.

The second threshold voltage Vth2 is set to be a predetermined central voltage value, i.e. a representative voltage value, defined for the output voltage Vf of each temperature-sensitive diode SD*# when the actual temperature of a corresponding switching element S*# is maintained at the second threshold temperature Tth2.

An output terminal of the second comparator 54 is connected to the drive controller 58. Specifically, the second comparator 54 is operative to output a high-level signal defined as a logical high level if the output voltage Vf of the temperature-sensitive diode SD*# inputted to the non-inverting terminal of the second comparator 54 is higher than the second terminal voltage Vth2 inputted to the inverting input terminal thereof. The second comparator 54 is also operative to output a low-level signal defined as a logical low level if the output voltage Vf of the temperature-sensitive diode SD*# inputted to the non-inverting terminal of the second comparator 54 is lower than the second terminal voltage Vth2 inputted to the inverting input terminal thereof.

The drive controller 58 is operative to perform a charging task and a discharging task for the gate of the switching element S*# using the drive signal g*# input thereto from the controller 14 via the photocoupler 18a and the terminal T8.

Note that the capacitor 50 serves to keep the constant-voltage source 48 to be stable, and the low-pass filter 52 serves to prevent high-frequency noise components from being recognized by the controller 14 as level change of the fail-safe signal FL.

Let us describe the charging task and the discharging task hereinafter.

First, let us describe the charging task hereinafter.

The drive controller 58 is configured to turn on the charge switching element 26 if the drive signal g*# having a predetermined logical level defined as an on command is input thereto. This charges the gate of the switching element S*# based on a charge current to be supplied to the gate of the switching element S¥# from the constant voltage source 24 through the charging register 22 and the terminals T1 and T2, thus turning on the switching element S*#.

In the first embodiment, the drive controller 58 is configured to perform the charging task for the gate of the switching element S*# using constant-current control. Specifically, the drive controller 58 controls a level of voltage to be applied to the gate of the charge switching element 26 to regulate the voltage drop across the charging resistor 22 to a target value of, for example, 1 V if the drive signal g*# as the on command is input thereto. This regulation adjusts, to a constant level, the charge current to be supplied to the gate of the switching element S¥#. The charging task results in the suppression of a surge produced due to the shift of the switching element S¥# from an off state to an on state. Note that the discharging switching element 30 is kept off during the period while the charging task is carried out.

Next, let us describe the discharging task hereinafter.

The drive controller 58 is configured to perform the discharging task for the gate of the switching element S*#. Specifically, the drive controller 58 turns on the discharge switching element 30 and off the charge switching element 26 if the drive signal g*# having a predetermined logical level defined as an off command is input thereto. This discharges the gate of the switching element S*#, thus turning off the switching element S*#.

Next, let us describe a local shutdown task carried out by the drive controller 58 hereinafter. That is, the drive controller 58 has a local shutdown function F (see FIG. 2) that performs the local shutdown task.

The local shutdown task is designed to disable drive, i.e. turn-on, of the switching element S*# if the output voltage Vf of the temperature-sensitive diode SD*# is lower than the second threshold voltage Vth2, i.e. the temperature of the switching element S*# is higher than the second threshold temperature Tth2, whereby the output signal from the second comparator 54 has the logical low level. In other words, the local shutdown task is designed such that the drive controller 58 locally disables drive of the switching element S*# without involving the controller 14 if it is determined that the switching element S*# is overheated. Disabling drive of the switching element S*# results in rapid turn-off, i.e. rapid shutdown, of the switching element S*#, thus preventing reduction of the reliability of the inverter IV due to the overheating of the switching element S*#.

Next, let us describe the power saving task carried out by the controller 14 hereinafter.

The power saving task is designed to reduce the request torque Tr* for the output torque of the motor-generator 10 as its controlled variable while it is determined that the fail-safe signal FL has the logical high level. The power saving task aims to limit drive, i.e. turn-on, of the target switching element S*#, thus reducing the duty cycle of the drive signal g*# for the target switching element S*#. This limitation of on duration of the target switching element S*# reduces the total amount of a collector current Ice flowing through the target switching element S*#, thus suppressing the increase in the temperature of the target switching element S*# and saving power to be supplied to the motor-generator 10.

Let us describe the power saving task in detail hereinafter.

Figure 3:
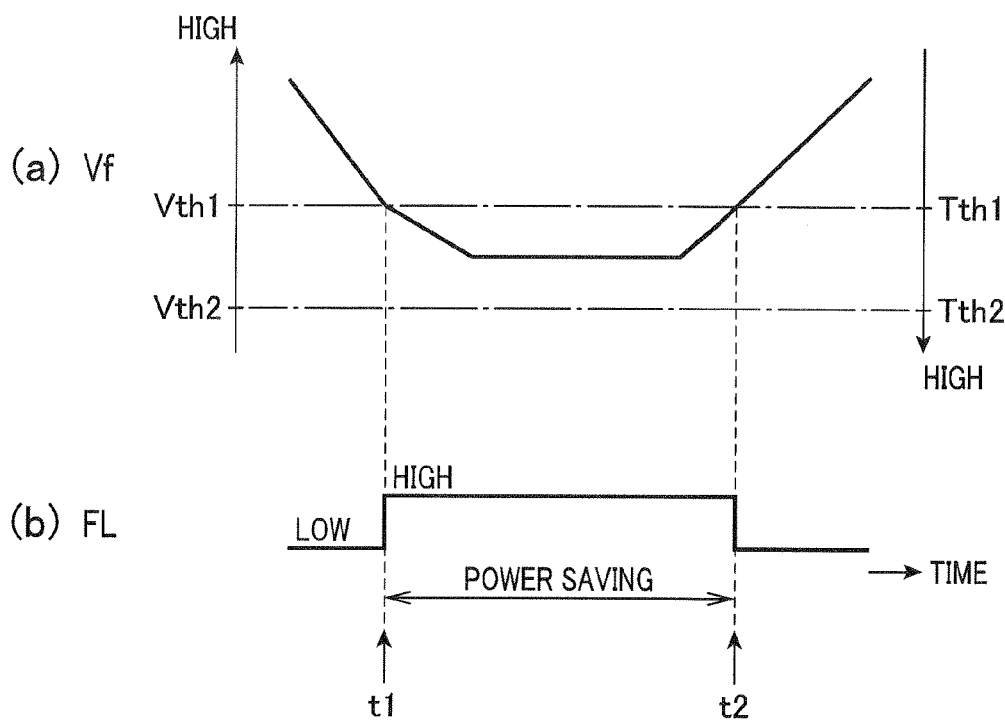
FIG. 3 is a timing chart schematically illustrating how a power saving task according to the first embodiment is performed by a controller illustrated in FIGS. 1 and 2.

FIG. 3 schematically illustrates how the power saving task is performed by the controller 14. Specifically, how the output voltage Vf of the target temperature-sensitive diode SD*# varies is illustrated in (a) of FIG. 3, and how the fail-safe signal FL input to the controller 14 varies is illustrated in (b) of FIG. 3. Note that, as described above, the target temperature-sensitive diode SD*# whose output voltage Vf is illustrated in (a) of FIG. 3 corresponds to the target switching elements S*#, the temperature of which is assumed to increase to the highest level in the temperatures of all the switching elements S*#. In addition, note that the right vertical axis illustrated in (a) of FIG. 3 shows the temperature of the target switching element S*# corresponding to the output voltage Vf.

In the example illustrated in FIG. 3, when the temperature of the target switching element S*# is lower than the first threshold temperature Tth1 so that the output voltage Vf of the target temperature-sensitive diode SD*# is higher than the first threshold voltage Vth1 before time t1, the high-level signal is output from the high voltage system. This turns on the photodiode 41a, thus turning on the phototransistor 41b. The turn-on of the phototransistor 41b reduces the potential at the input terminal of the low-pass filter 52 down to the logical low level, resulting in the fail-safe signal FL having the logical low level (LOW in (a) of FIG. 3) being output to the controller 14. Because the fail-safe signal FL has the logical low level, the controller 14 operates in a normal mode without performing the power saving task, and therefore, the controller 14 drives the target switching element S*# based on the duty cycle required to adjust a value of the output torque of the motor-generator 10 to the request torque Tr*.

When the temperature of the target switching element S*# increases, passing through the first threshold temperature Tth1 so that the output voltage Vf of the target temperature-sensitive diode SD*# decreases, passing through the first threshold voltage Vth1 at the time t1, the low-level signal is output from the high voltage system. This changes the photodiode 41a from the on state to the off state, thus changing the phototransistor 41b from the on state to the off state. The turn-off of the phototransistor 41b increases the potential at the input terminal of the low-pass filter 52 up to the logical high level, resulting in the fail-safe signal FL being changed from the logical low level to the logical high level (HIGH in (a) of FIG. 3). Because the fail-safe signal FL output to the controller 14 has the logical high level, the controller 14 operates in a power saving mode to perform the power saving task.

Specifically, the controller 14 reduces the request torque Tr* input from the host computer HC to thereby reduce the duty cycle of the target switching element S*#. This limitation of on duration of the target switching element S*# reduces the total amount of the collector current Ice flowing through the target switching element S*# to thereby suppress the increase in the temperature of the target switching element S*#, resulting in drop of the temperature of the target switching element S*#.

Thereafter, when the temperature of the target switching element S*# decreases, passing through the first threshold temperature Tth1 so that the output voltage Vf of the temperature-sensitive diode SD*# increases, passing through the first threshold voltage Vth1 at time t2, the high-voltage signal is output from the first comparator 38. This changes the photodiode 41a from the off state to the on state, thus changing the phototransistor 41b from the off state to the on state.

The turn-on of the phototransistor 41b reduces the potential at the input terminal of the low-pass filter 52 down to the logical low level, resulting in the fail-safe signal FL being changed from the logical high level to the logical low level (LOW in (a) of FIG. 3). Because the fail-safe signal FL output to the controller 14 has the logical low level, the controller 14 cancels the power saving mode to terminate the power saving task, and shifts to the normal mode, thus operating in the normal mode to control the target switching element S*# based on the request torque Tr* input from the host computer HC.

That is, the first comparator 38 serves as a determiner configured to determine whether the target switching element S*# is in a specified temperature state, i.e. higher in temperature than the first threshold temperature Tth1, and the determined result is output to the controller 14 via the interface 18 as the fail-safe signal FL.

As described above, the drive IC 20 of the drive unit DU provided for a target switching element S*#, the temperature of which is assumed to increase to the highest level in the temperatures of all the switching elements S*#, is specially configured to:

determine how to drive the target switching element S*#, i.e. determine whether to perform the power saving task; and output, to the controller 14 via the interface 18, information indicative of the determined result, i.e. the fail-safe signal FL having the logical high level or the logical low level.

Let us describe the special configuration of the drive IC 20 in comparison to the known system disclosed in the Patent Publication No. 2009-171312.

As described above, the known system is designed to:

frequency-modulate the output signal, which shows a measured temperature of a corresponding switching element;

output from a temperature-sensitive diode located in the high-voltage system; and send the frequency-modulated output signal to a microcomputer located in the low-voltage system via a corresponding photocoupler as a communication medium between the high- and low-voltage systems.

Thus, the microcomputer located in the low-voltage system determines whether the temperature of the switching element obtained based on the frequency-modulated output signal exceeds a threshold temperature, i.e. whether to perform the power saving task.

However, the known system needs to send the frequency-modulated output signal from the temperature-sensitive diode, which includes information about the measured temperature of a corresponding switching element, through the communication medium, such as a photocoupler. This may cause error components to be contained in the frequency-modulated output signal including information about the measured temperature of the switching element; the information is used by the microcomputer for the determination of whether to perform the power saving task. An increase in the magnitude of the error components may reduce the controller's accuracy of determining whether to perform the power saving task.

In contrast, the special configuration of the drive IC 20 determines whether to perform the power saving task without involving the controller 14, i.e. without transfer of the analog voltage signal including information about the measured temperature of the switching element S*#. After the determination, the special configuration of the drive IC 20 transfers the results of the determination to the controller 14 via the interface 18 as the fail-safe signal FL. Thus, the special configuration of the drive IC 20 performs the determination of whether to perform the power saving task without having little effect from transfer of information from the drive IC 20 to the controller 14 via the interface 18. This results in great reduction of the possibility of error components due to information transfer through the interface 18 affecting on the determination, in other words, containing in the information about the measured temperature of the target switching element S*#. This makes it possible for the special configuration of the drive IC 20 to improve the accuracy of determining whether to perform the power saving task in comparison to the known system, avoiding the reduction in the reliability of the switching element S*#.

Particularly, information transferred from the target temperature-sensitive diode shows the temperature of the target switching element S*#, which varies over time, whereas information transferred from the first comparator 38 to the controller 14 via the interface 18 shows any one of the logical high level, i.e. the high impedance output, and logical low level, i.e. the low impedance output.

Thus, the accuracy required for the transfer of the information from the first comparator 38 to the controller 14 via the interface 18 is lower than that required for the transfer of the information from the target temperature-sensitive diode SD*# to the first comparator 38.

This is because the amount of the information, which is transferred from the target temperature-sensitive diode SD*# to the first comparator 38, is greater than the amount of the information, which is transferred from the first comparator 38 to the controller 14 via the interface 18.

That is, the signal transferred from the target temperature-sensitive diode SD*# to the first comparator 38 is an analog voltage signal continuously varying depending on the variation in the temperature of the switching element S*#. In contrast, the signal transferred from the first comparator 38 to the controller 14 via the interface 18 is a binary signal indicative of one of the logical high level and logical low level.

As described above, the amount of the information, which is transferred from the first comparator 38 via the interface 18 to the controller 14, is lower than that of the information, which is transferred from the target temperature-sensitive diode SD*# to the first comparator 38. For this reason, it is possible to reduce the possibility of error components due to information transfer through the interface 18 affecting the controller 14 to determine whether to actually perform the power saving task based on the binary signal.

The amount of information, which is transferred from the drive IC 20, i.e. the high-voltage system, to the controller 14, i.e. the low-voltage system, is lower than the amount of information, which is transferred from the high-voltage system to the low-voltage system according to the known system. Thus, the information-transfer capability of the photocoupler 41 of the interface 18 can be lower than that of the photocoupler of the known system for transferring information about the measured temperature of a switching element. In addition, frequency modulators, which are used in the known system for faster transfer of information about the measured temperature of a switching element, are eliminated in the drive IC 20. The special configuration of the drive IC 20 therefore results in lower cost of the control system 100 in comparison to the known system.

The special configuration of the drive IC 20 performs the local shutdown task to disable drive of the target switching element S*# upon determination that the output signal from the second comparator 54 is changed from the logical high level to the logical low level. This disables more immediately drive of the target switching element S*# if the target switching element SD*# is overheated in comparison to the structure that the controller 14 disables drive of the target switching element S*#.

Figure 4:
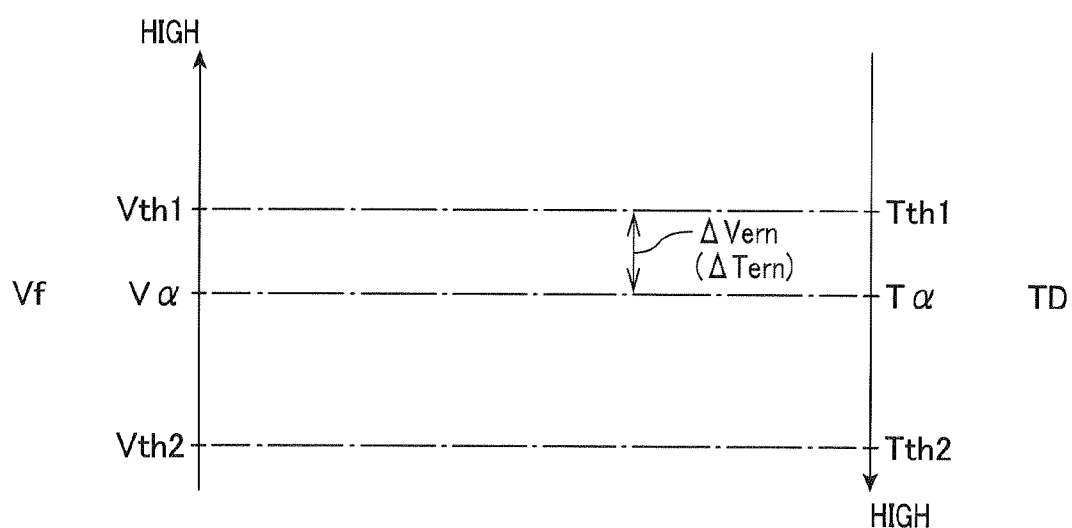
FIG. 4 is a view schematically illustrating how a first threshold voltage is determined according to the first embodiment.

Note that, the output voltage Vf of the target temperature-sensitive diode SD*# may be shifted from the central voltage value defined therefor due to, for example, the variations in the temperature-voltage characteristics of the temperature-sensitive diodes SD*#, the variations in the circuits for measuring the temperatures of the switching elements S*# including the constant voltage sources 36, or the like. In this case, the start of the power saving task may be delayed. In order to avoid the delay, the first threshold voltage Vth1 can be set as illustrated in FIG. 4. In FIG. 4, the left vertical axis shows the output voltage Vf, and the right vertical axis shows the temperature TD of the target switching element S*# corresponding to the output voltage Vf.

In FIG. 4, an upper limit, such as 150° C., of the temperature of the target switching element S*# at which the target switching element S*# can be driven using the power saving task is defined as a specified temperature T$\alpha$. In addition, a central voltage value, i.e. a representative voltage value, of the output voltage Vf of each temperature-sensitive diode SD*# when the actual temperature of a corresponding switching element S*# is maintained at the specified temperature T$\alpha$ is defined as a specified voltage V$\alpha$. The first threshold voltage Vth1 is set to a voltage value obtained by adding a low-temperature voltage error $\Delta$Vern, which is caused due to an individual variability of each temperature-sensitive diode SD*#, to the specified voltage V$\alpha$.

Note that the low-temperature voltage error $\Delta$Vern is defined as a maximum variation, at the low-temperature side relative to the specified temperature T$\alpha$ corresponding to the specified voltage V$\alpha$, in the output voltages of mass-produced temperature-sensitive diodes including the temperature-sensitive diodes SD*# when the actual temperature of a corresponding switching element S*# is maintained at the specified temperature T$\alpha$.

The first threshold voltage Vth1 set described above permits the controller 14 to start the power saving task before the actual temperature of the target switching element S*# exceeds the specified temperature T$\alpha$ even if there is a variation in the temperature-voltage characteristics of the target temperature-sensitive diodes SD*#. This prevents the reliability of the target switching element S*# from dropping due to the temperature of the target switching element S*#.

Note that, in FIG. 4, a low-temperature error $\Delta$Tern, which is obtained by converting the low-temperature voltage error $\Delta$Vern to a temperature value, is illustrated with the low-temperature voltage error $\Delta$Vern. Subtraction of the low-temperature error $\Delta$Tern from the specified temperature T$\alpha$ obtains the first threshold temperature Tth1. The low-temperature error $\Delta$Tern is defined as a maximum variation, at the low-temperature side relative to the specified temperature T$\alpha$, in the measured temperatures corresponding to the output voltages of mass-produced temperature-sensitive diodes including the temperature-sensitive diodes SD*# when the actual temperature of a corresponding switching element S*# is maintained at the specified temperature T$\alpha$.

In the control system 100 according to the first embodiment, the temperature-information sending unit 18b is provided for one of the switching elements S*#, the temperature of which is assumed to increase to the highest level in the temperatures of all the switching elements S*#. This results in a lower number of components, such as the photocoupler 41 and the like, of the temperature-sending unit 18, in comparison to the structure that the temperature-information sending units 18b are provided for the respective switching elements S*#.

Second Embodiment

A control system for controlling the motor-generator 10 according to a second embodiment of the present disclosure will be described with reference to FIGS. 5 and 6.

The structure and/or functions of the control system according to the second embodiment are mainly identical to those of the control system according to the first embodiment except for the following points. So, the different points will be mainly described hereinafter.

The control system according to the second embodiment is designed such that the timing to terminate the power saving task is different from that to terminate power saving task according to the first embodiment.

Figure 5:
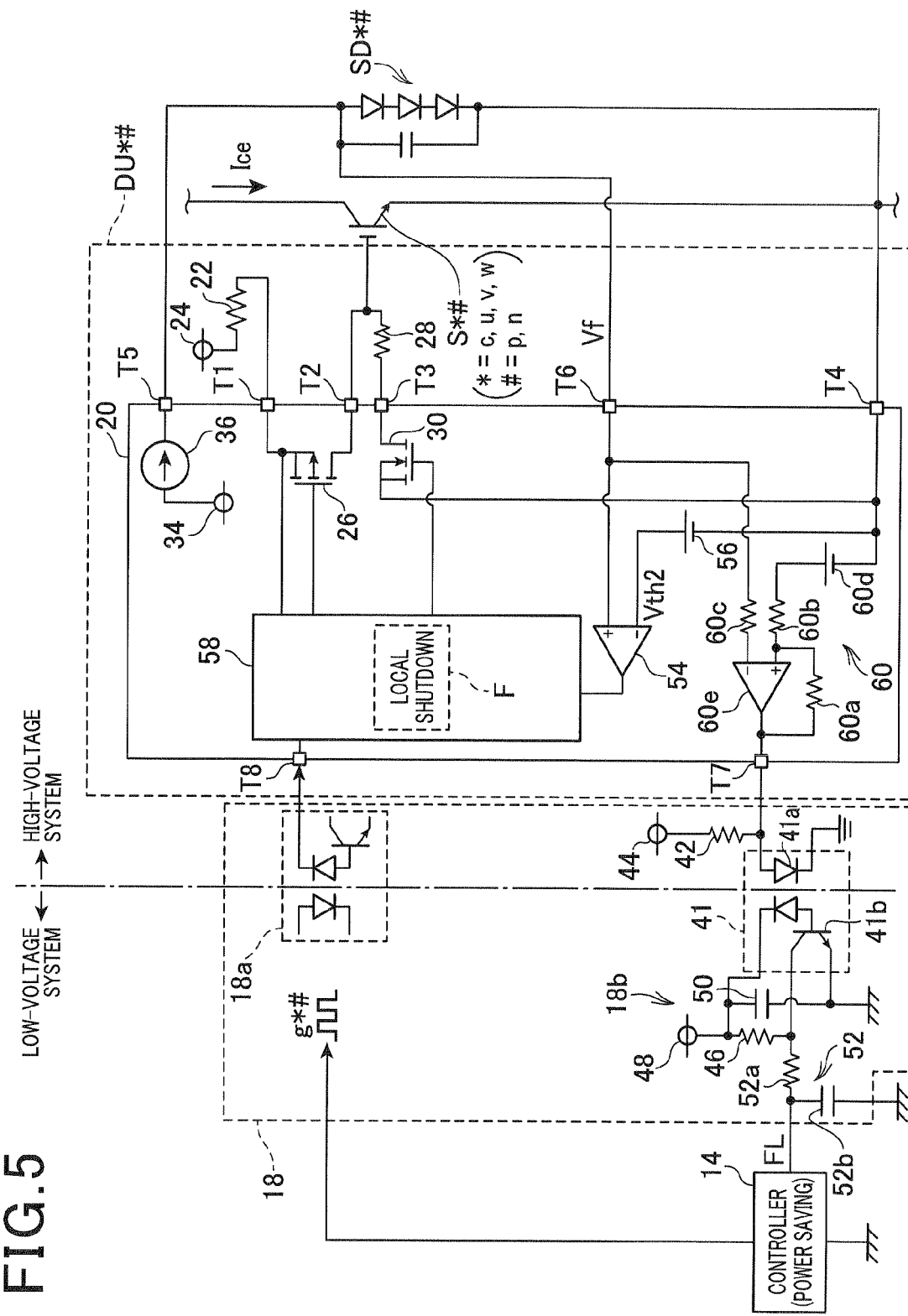
FIG. 5 is a circuit diagram schematically illustrating an example of the structures of a drive unit and an interface of a control system for a motor-generator according to a second embodiment of the present disclosure.

FIG. 5 schematically illustrates an example of the structure of a drive unit DU*# provided for the target switching element S*#.

As illustrated in FIG. 5, the drive unit DU*# is provided with a Schmitt-trigger comparator circuit 60. The Schmitt-trigger comparator circuit 60 includes a first comparator 60e and a first power supply source 60d in place of the first comparator 38 and the first power supply source 40. The Schmitt-trigger comparator circuit 60 also includes resistors 60a, 60b, and 60c.

The terminal T6 is connected to an-inverting input terminal of the first comparator 60e via the resistor 60c. To a non-inverting input terminal of the first comparator 60e, the positive terminal of the first power supply source 60d having a first terminal voltage, i.e. the first threshold voltage Vth1, thereacross is connected via the resistor 60b. The negative terminal of the first power supply source 60d is connected to the terminal T4. The non-inverting input terminal is positively fed back to be connected to an output terminal of the first comparator 60e via the resistor 60a. The output terminal of the first comparator 60e is connected to the interface 18 via the terminal T7.

In addition, the controller 14 according to the second embodiment is configured to:

operate in the power saving mode to perform the power saving task when the fail-safe signal FL has the logical low level; and operate in the normal mode to drive the target switching element S*# without performing the power saving task when the fail-safe signal FL has the logical high level.

Let us describe the power saving task according to the second embodiment in detail hereinafter.

Figure 6:
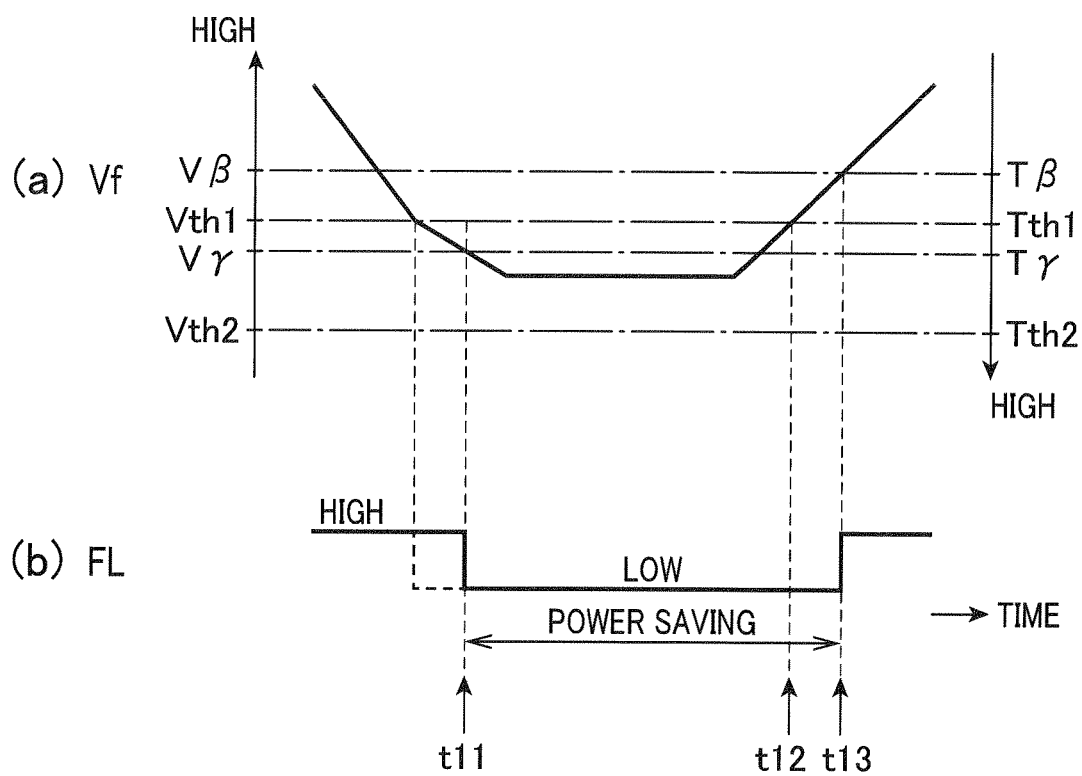
FIG. 6 is a timing chart schematically illustrating how a power saving task according to the second embodiment is performed by a controller illustrated in FIG. 5.

FIG. 6 schematically illustrates how the power saving task is performed by the controller 14. Specifically, how the output voltage Vf of the target temperature-sensitive diode SD*# varies is illustrated in (a) of FIG. 6, and how the fail-safe signal FL input to the controller 14 varies is illustrated in (b) of FIG. 6. That is, (a) of FIG. 6 corresponds to (a) of FIG. 3, and (b) of FIG. 6 corresponds to (b) of Fig.

In the example illustrated in (a) of FIG. 6, the output voltage Vf of the target temperature-sensitive diode SD*# is equal to or lower than a lower-hysteresis threshold voltage Vγ lower than the first threshold voltage Vth1 based on the positive feedback of the first comparator 60e, so that the high-voltage signal is output from the first comparator 60e at time t11. At the time t11, the temperature of the target switching element S*# is higher than a predetermined higher threshold temperature Tγ higher than the first threshold temperature Tth1. This turns on the photodiode 41a, thus turning on the phototransistor 41b. The turn-on of the phototransistor 41b reduces the potential at the input terminal of the low-pass filter 52 down to the logical low level, resulting in the fail-safe signal FL having the logical low level (LOW in (a) of FIG. 6) being output to the controller 14. Because the fail-safe signal FL has the logical low level, the controller 14 operates in the power saving mode to perform the power saving task.

When the temperature of the target switching element S*# decreases, passing through the first threshold temperature Tth1, the output voltage Vf of the target temperature-sensitive diode SD*# increases, passing through the first threshold voltage Vth1 at time t12. However, even if the output voltage Vf of the target temperature-sensitive diode SD*# becomes higher than the first threshold voltage Vth1, the low-voltage signal is continuously output from the first comparator 60e. This results in the controller 14 continuously performing the power saving task.

When the temperature of the target switching element S*# further decreases, passing through a predetermined lower threshold temperature Tβ lower than the first threshold temperature Tth1 at time t13, the output voltage Vf of the target temperature-sensitive diode SD*# increases, passing through a predetermined higher-hysteresis threshold voltage Vβ; the higher-hysteresis threshold voltage Vβ is set to be higher than the first threshold voltage Vth1 based on the positive feedback of the first comparator 60e. This results in the high-voltage signal being output from the first comparator 60e. This changes the photodiode 41a from the on state to the off state, thus changing the phototransistor 41b from the on state to the off state. The turn-off of the phototransistor 41b increases the potential at the input terminal of the low-pass filter 52 up to the logical high level, resulting in the fail-safe signal FL being changed from the logical low level to the logical high level (HIGH in (a) of FIG. 6). Because the fail-safe signal FL output to the controller 14 has the logical high level, the controller 14 operates in the normal mode to control drive of the target switching element S*# without performing the power saving task.

Note that adjustment of the resistances of the respective resistors 60a and 60b and the terminal voltage of the first power supply source 60d permits the correlations between the first threshold voltage Vth1 and each of the lower- and higher-hysteresis threshold voltages Vγ and Vβ to be defined.

Other structures and functions of the control system according to the second embodiment are substantially identical to those of the control system 100 according to the first embodiment, so the descriptions of which are omitted.

As described above, the control system according to the second embodiment is configured to determine whether to perform the power saving task using the lower-hysteresis threshold voltage Vγ lower than the first threshold voltage Vth1 and the higher-hysteresis threshold voltage Vβ higher than the first threshold voltage Vth1. This configuration results in delaying the start of the power saving task, thus makes it possible to cancel the power saving task after sufficient drop of the temperature of the target switching element S*#.

The control system according to the second embodiment is also configured to prevent the output signal from the first comparator 60e from being changed between the logical high and low levels infinitely fast, i.e. "chattering", due to fluctuations of the output voltage Vf from the target temperature-sensitive diode SD*# back and fourth around the first threshold voltage Vth1. This makes it possible to prevent frequent start and stop of the power saving task.

Other effects achieved by the control system according to the second embodiment are the same as those achieved by the control system 100 according to the first embodiment, and therefore, the descriptions of which are omitted.

Third Embodiment

A control system for controlling the motor-generator 10 according to a third embodiment of the present disclosure will be described with reference to FIGS. 7 and 8.

The structure and/or functions of the control system according to the third embodiment are mainly identical to those of the control system according to the first embodiment except for the following points. So, the different points will be mainly described hereinafter.

The control system according to the third embodiment is designed to change how the fail-safe signal FL is output from the drive unit DU*# provided for the target switching element S*#.

Figure 7:
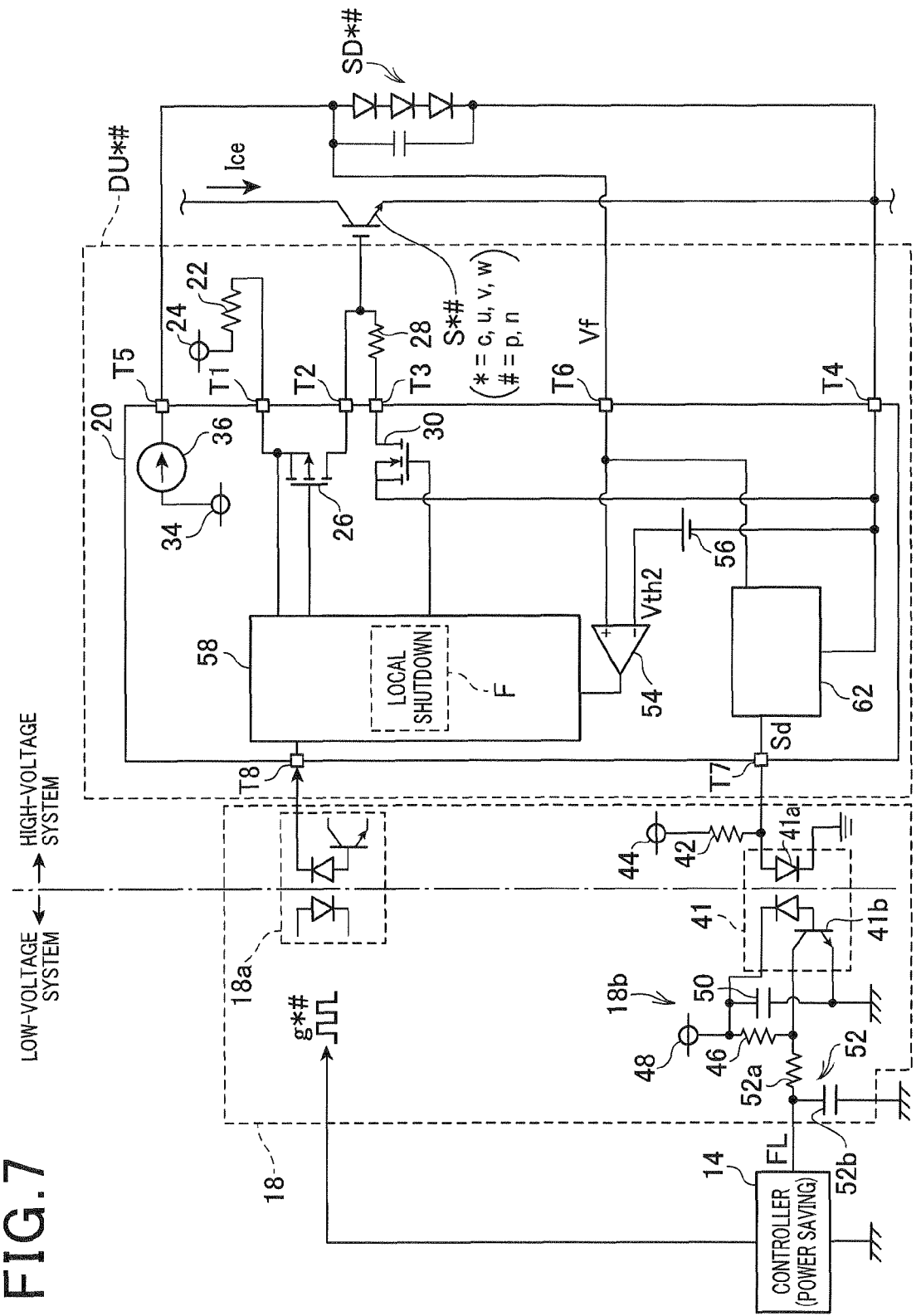
FIG. 7 is a circuit diagram schematically illustrating an example of the structures of a drive unit and an interface of a control system for a motor-generator according to a third embodiment of the present disclosure.

FIG. 7 schematically illustrates an example of the structure of the drive unit DU*# provided for the target switching element S*#.

As illustrated in FIG. 7, the drive unit DU*# is provided with a determining module 62 in place of the first comparator 38 and the first power supply source 40. The terminals T4, T6, and T7 are connected to the determining module 62. The determining module 62 includes a power supply source and a carrier-wave generator, and is operative to:

generate a variable-duty signal Sd according to a carrier wave signal, such as a triangular wave signal, generated by the carrier-wave generator and the output voltage Vf of the target temperature-sensitive diode SD*# input thereto via the terminal T6; and output the variable-duty signal Sd to the interface 18 via the terminal T7.

FIG. 8 schematically illustrates the correlation between the output voltage Vf of the target temperature-sensitive diode SD*# and the variable-duty signal Sd output from the determining module 62. Specifically, how the output voltage Vf of the target temperature-sensitive diode SD*# varies is illustrated in (a) of FIG. 8, how the variable-duty signal Sd varies is illustrated in (b) of FIG. 8, and how the fail-safe signal FL input to the controller 14 varies is illustrated in (c) of FIG. 8. (a) and (c) of FIG. 8 correspond to (a) and (b) of FIG. 3, respectively.

The determining module 62 has a third threshold voltage Vth3 higher than the first threshold voltage Vth1. The third threshold voltage Vth3 is set to a value that permits the determining module 62 to determine that there is an open fault occurs in the target temperature-sensitive diode SD*# or in the electrical path from the target temperature-sensitive diode SD*# to the emitter of the target switching element S*#. In the third embodiment, the third threshold voltage Vth3 is set to be slightly lower than the terminal voltage of the constant voltage source 34.

Specifically, when the output voltage Vf of the target temperature-sensitive diode SD*# is higher than the third threshold voltage Vth3, the determining module 62 determines that there is an open fault in the target temperature-sensitive diode SD*# or in the electrical path between the temperature-sensitive diode SD*# and the emitter of the target switching element S*#. This is because no current flows through the temperature-sensitive diode SD*# or the electrical path. Then, the determining module 62 compares a first reference voltage with the triangular-wave signal generated by the carrier-wave generator, thus generating the variable-duty signal SD having a duty cycle DC1.

The duty cycle DC1, i.e. a predetermined ratio of the logical high-level duration to a predetermined total duration of the logical high- and low-levels for each cycle of transmission of the set of logical high- and low-levels. The duty cycle DC1 of the variable-duty signal SD is required for the fail-safe signal FL to have a first duty cycle D1, which is set to be higher than 50% and lower than 100%.

On the other hand, when the output voltage Vf of the target temperature-sensitive diode SD*# is equal to or lower than the third threshold voltage Vth3, and higher than the first threshold voltage Vth1, the determining module 62 determines that there is no need to perform the power saving task, i.e. there is a normal state for the temperature of the target switching element S*#. Then, the determining module 62 compares a second reference voltage with the triangular-wave signal generated by the carrier-wave generator, thus generating the variable-duty signal SD having a duty cycle DC2. The duty cycle DC2 of the variable-duty signal SD is required for the fail-safe signal FL to have a second duty cycle D2 different from the first duty cycle D1, which is set to be, for example, higher than 0% and lower than 50%.

In addition, when the output voltage Vf of the target temperature-sensitive diode SD*# is equal to or lower than the first threshold voltage Vth1, and higher than the second threshold voltage Vth2, the determining module 62 determines that there is a need to perform the power saving task. Then, the determining module 62 compares a third reference voltage with the triangular-wave signal generated by the carrier-wave generator, thus generating the variable-duty signal SD having the fixed logical low level, in other words, 0% duty cycle, which is required for the fail-safe signal FL to have the fixed logical high level, i.e. a 100% duty cycle.

On the other hand, when the output voltage Vf of the target temperature-sensitive diode SD*# is equal to or lower than the second threshold voltage Vth2, the determining module 62 determines that the target switching element S*# is overheated. Then, the determining module 62 compares a fourth reference voltage with the triangular-wave signal generated by the carrier-wave generator, thus generating the variable-duty signal SD having the fixed logical high level, in other words, 100% duty cycle, which is required for the fail-safe signal FL to have the fixed logical low level, i.e. a 0% duty cycle.

When it is determined that the fail-safe signal FL has the logical low level, the controller 14 shuts down the comparator CV and the inverter IV, thus preventing overheating of the target switching element S*#.

Other structures and functions of the control system according to the third embodiment are substantially identical to those of the control system 100 according to the first embodiment, so the descriptions of which are omitted.

As described above, the control system according to the third embodiment is configured to generate the different fail-safe signals FL that respectively correspond to:

the first state in which there is an open fault in the target temperature-sensitive diode SD*# or the electrical path from the target temperature-sensitive diode SD*# to the emitter of the target switching element S*#;

the second state in which there is no need to perform the power saving task, i.e. there is a normal state for the temperature of the target switching element S*#;

the third state in which there is a need to perform the power saving task; and the fourth state in which the target switching element S*# is overheated.

This configuration allows the controller 14 to properly determine, based on one of the different fail-safe signals FL output from the drive unit DU*#, which of the first to fourth states occur in the control system.

In addition, the control system according to the third embodiment is configured such that the common photocoupler 41 transfers the variable-duty signals SD different from each other from the drive unit DU*# to the controller 14. This configuration results in lower manufacturing cost of the control system in comparison to using individual photocouplers for transfer of the respective variable-duty signals SD different from each other.

With the control system according to the third embodiment, if there is an open fault at the terminal T7 or an electrical path including the terminal T7, a logical low-level signal, different from the variable-duty signals SD in the second state, i.e. the normal state, is input to the controller 14 as the fail-safe signal FL. Thus, it is possible for the controller 14 to perform the power saving task in response to the logical low-level signal if an open fault occurs at the terminal T7 or the electrical path including the terminal T7.

Fourth Embodiment

A control system for controlling the motor-generator 10 according to a fourth embodiment of the present disclosure will be described with reference to FIG. 9.

The structure and/or functions of the control system according to the fourth embodiment are mainly identical to those of the control system according to the first embodiment except for the following points. So, the different points will be mainly described hereinafter.

In the fourth embodiment, when the external signals SIG output from the host computer HC include an instruction indicative of whether to disable the power saving task, the controller 14 is designed to perform a power-saving disabling task that:

determines whether to disable the power saving task based on the input external signals;

disables the power saving task when it is instructed to disable it; and continuously operate in the normal mode to without performing the power saving task to drive the target switching element S*# based on the duty cycle required to adjust a value of the output torque of the motor-generator 10 to the request torque Tr*.

Specifically, the host controller HC is operative to output an instruction, referred to as a disabling instruction, indicative of disabling the power saving task to the controller 14 when determining that the hybrid vehicle is under a situation in which the driver of the hybrid vehicle wants to increase the output torque of the motor-generator 10.

As an example of the situation, the hybrid vehicle is under a situation in which the running speed of the hybrid vehicle is low or zero, and the request torque Tr* for the output torque of the motor-generator 10 is equal to or higher than a predetermined value. In other words, the hybrid vehicle is under a situation in which the hybrid vehicle is running a steep slope or the hybrid vehicle is being locked.

For example, the disabling instruction is continuously output from the higher-level controller unless the duration of the output of the disabling signal exceeds predetermined time. This feature aims to address a possibility of reducing the reliability of the target switching element S*# due to overheating of the target switching element S*# if drive of the target switching element S*# is continuously performed according to the disabling instruction while the power-saving task is needed.

FIG. 9 schematically illustrates an example of specific steps of the power-saving disabling task carried out by the controller 14. The controller 14 is programmed to execute the power-saving disabling task every preset cycle.

When trying to execute the power-saving disabling task, the controller 14 receives the external signals, and determines whether the external signals include the disabling instruction output from the host controller HC in step S10. In other words, in step S10, the controller 14 determines whether it is instructed to disable the power saving task based on the external signals. Upon determination that the disabling instruction is included in the external signals, so that the controller 14 is instructed to disable the power saving task (YES in step S10), the controller 14 carries out the operation in step S12, and disables execution of the power saving task in step S12. For example, the controller 14 sets a power-saving disabling flag stored in its memory to 1 in step S12; a value of 1 for the power-saving disabling flag shows that the power saving task is disabled.

Otherwise, upon determination that no disabling instructions are included in the external signals, so that the controller 14 is instructed to enable the power saving task (NO in step S10), the controller 14 carries out the operation in step S14, and enables execution of the power saving task in step S14. For example, the controller 14 sets the power-saving disabling flag stored in its memory to 0 in step S14; a value of 0 for the power-saving disabling flag shows that the power saving task is enabled.

After completion of the operation in step S12 or step S14, the controller 14 terminates the power-saving disabling task.

Other structures and functions of the control system according to the fourth embodiment are substantially identical to those of the control system 100 according to the first embodiment, so the descriptions of which are omitted.

As described above, the control system according to the fourth embodiment is configured to disable execution of the power saving task if a driver of the hybrid vehicle wants to increase the output torque of the motor-generator 10, thus enabling an increase in the output torque of the motor-generator 10 in response to the driver's intention. This configuration maintains the drivability of the hybrid vehicle at a high level.

The drive units DU and the control system 100 according to each of the first to fourth embodiments can be modified as follows:

The controller 14 is configured to reduce the request torque Tr* to limit drive of the target switching element S*# as a module for determining how to drive the target switching element S*#, but the present disclosure is not limited thereto. Specifically, the controller 14 can be configured to disable drive of the target switching element S*# as a module for determining how to drive the target switching element S*#.

The request torque Tr* is used as a controlled parameter required for the controller 14 to determine how to drive the target switching element S*#, but the present disclosure is not limited thereto.

Specifically, the controller 14 can be configured to convert the request torque Tr* into a command d-axis current id* and a command q-axis current iq* in a d-q coordinate system of the rotor based on the request torque Tr* as the controlled parameter. The command d- and q-axis currents id* and iq* are required to adjust the output torque of the motor-generator 10 to the request torque Tr*

The controller 14 can also be configured to perform known current feedback control to:

measure a d-axis current id and a q-axis current iq actually flowing in the motor-generator 10 as three-phase currents;

adjust the command d- and q-axis currents id* and iq* such that the command d- and q-axis currents id* and iq* match with the actual d- and q-axis currents id and iq fed back from the motor-generator 10; and perform the power saving task that reduces the command d- and q-axis currents id* and iq* to limit drive of the target switching element S*# when it is determined that the fail-safe signal FL having the logical high level is input thereto (see the first, third or fourth embodiment) or determined that the fail-safe signal FL having the logical low level is input thereto (see the second embodiment).

The first power supply source 40 connected to the first comparator 38 and the second power supply source 56 connected to the second comparator 54 can be attached to the drive IC 20 as external devices.

In each embodiment, the target temperature-sensitive diode SD*# serving as a module for measuring the temperature of the target switching element S*# is configured to measure the temperature of the target switching element S*# based on the constant current, which is supplied from the constant current source 36, flowing therethrough. The present disclosure is however not limited to the configuration. Specifically, the target temperature-sensitive diode SD*# can be configured to measure the temperature of the target switching element S*# based on a current If that flows therethrough based on a constant voltage applied across the temperature-sensitive diode SD*#. In this modification, the amount of the current If increases with an increase in the temperature of the target switching element S*#.

As a module for measuring the temperature of the target switching element S*#, a resistance temperature detector can be used in place of each temperature-sensitive diode SD*#. The resistance temperature detector is located close to a switching element S*#, has a resistance element, and measures the temperature of the target switching element S*# using its characteristics that, as the temperature of the resistance element increases, the electrical resistance thereof increases.

In the first embodiment, a module for determining whether the target switching element S*# is in the specified temperature state is configured as the first comparator 38 to output, to the controller 14, the results of the determination of whether the temperature of the target switching element S*# is higher than the first threshold temperature Tth1. However, the present disclosure is not limited to the configuration. Specifically, the determining module can be configured to determine whether the rate of drop of the output voltage Vf, i.e. the rate of rise thereof, is equal to or higher than a preset rate.

The determining module, which is configured as the first comparator 38 to determine whether the output voltage Vf decreases, passing through the first threshold voltage Vth1, i.e. the temperature of the target switching element S*# increases, passing through the first threshold temperature Tth1, is not limited to the configuration. Specifically, the determining module can be configured to determine whether the output voltage Vf increases, passing through a given threshold voltage, i.e. the temperature of the target switching element S*# decreases, passing through a given threshold temperature. In this modification, the determining module can send, to the controller 14, the results of the determination of whether the target switching element S*# is in a low temperature state as the specified temperature state.

The determining module can be configured to determine whether the target switching element S*# is in the specified temperature state by only determining whether there is an open fault in the target temperature-sensitive diode SD*# or the electrical path from the target temperature-sensitive diode SD*# to the emitter of the target switching element S*#. The determining module can also be configured to determine whether the target switching element S*# is in the specified temperature state by only determining whether the target temperature-sensitive diode SD*# is overheated.

In the first embodiment, the first threshold voltage Vth1 can be set to be higher than the sum of the specified voltage Vα and the low-temperature voltage error ΔVern. In other words, the first threshold temperature Tth1 can be set to be lower than the subtraction of the low-temperature error ΔTern from the specified temperature Tα.

As described above, the first comparator 38, the first power supply source 40, and the temperature-information sending unit 18b are provided for one switching element S*# as a target switching element S*# whose temperature information is sent to the controller 14 via the interface 18, but the present disclosure is not limited thereto. Specifically, the first comparator 38, the first power supply source 40, and the temperature-information sending unit 18b can be provided for one or more switching elements S*# as target switching elements S*# whose temperature information are sent to the controller 14 via the interface 18.

In each of the first to fourth embodiments, the interface 18 serves as a communication medium that communicably connects between the high voltage system and the second voltage system, but the present disclosure is not limited thereto. Specifically, a high-side drive unit DU*p and a corresponding low-side drive unit DU*n can be communicably connected to each other via a communication medium 180. In this modification, one of the high- and low-side drive unit DU*p and DU*n can be configured to receive temperature information about a corresponding switching element from the other thereof, and determine how to drive the corresponding switching element based on the temperature information in the same approach as the first embodiment. The communication medium 180 is normally omitted in the control system 100 according to the first embodiment.

If the lower-voltage system includes a switching element and a temperature sensor for measuring the temperature of the switching element, the temperature information about the switching element, which is measured by the temperature sensor, can be transferred to the high-voltage system via the interface 18. At least one of the drive units DU can be configured to receive the temperature information about the switching element sent from the low voltage system, and determine how to drive the switching element based on the temperature information in the same approach as the first embodiment.

In the fourth embodiment, the controller 14 is designed to determine whether to disable the power saving task based on the disabling instruction included in the external signals SIG, but the present disclosure is not limited thereto. Specifically, if the external signals SIG include information indicative of the running speed of the hybrid vehicle or the operated amount of the accelerator operating member, the controller 14 can be designed to determine whether to disable the power saving task based on the information included in the external signals.

In each of the first to fourth embodiments, the converter CV serves as a DC power source, but the present disclosure is not limited thereto. Specifically, if the converter CV is deactivated or no converters CV are installed in the hybrid vehicle, the high-voltage battery 12 can serve as a DC power source.

In each of the first to fourth embodiments, the interface 18 is provided with light insulation members, such as photocouplers, but can be provided with magnetic insulation members, such as pulse transformers in place of the light insulation members.

As the switching elements S*#, IGBTs are used, but MOSFETs can be used as the switching elements S*#.

The control system and the motor-generator according to each of the first to fourth embodiments are installed in the hybrid vehicle, but they can be installed in an electric vehicle in which the motor-generator only serves as its main engine.

The drive units DU according to each of the first to fourth embodiments are applied to a power converter, such as a converter CV or an inverter IV, installed in motor vehicles, but the present disclosure is not limited to the application. Specifically, the drive units DU can be applied to a power converter for driving another machine, such as a compressor for air-conditioning, and also can be applied to another device except for such power converters.

While the illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driving system for driving a switching element, the driving system comprising:
    a first controller installed in a first system and configured to control the switching element;
    a temperature measuring module installed in a second system different from the first system and configured to measure a temperature of the switching element, and output a first signal representing the measured temperature of the switching element;
    a state determining module installed in the second system and comprising a first comparator configured to:
    compare the measured temperature of the switching element with a first threshold temperature based on the first signal;
    determine whether the switching element is in a specified temperature state based on a result of the comparison by the first comparator, and
    output a second signal representing a result of the determination to the first controller;
    a communication medium that communicably connects between the first system and the second system, the second signal output from the state determining module being transferred to the first controller via the communication medium,
    the first controller being configured to determine how to drive the switching element based on the second signal transferred thereto via the communication medium;
    a second comparator installed in the second system and configured to compare the measured temperature of the switching element with a second threshold temperature based on the first signal; and
    a second controller installed in the second system and configured to locally disable drive of the switching element if the measured temperature of the switching element is lower than the second threshold temperature based on a result of the comparison by the second comparator.

2. The driving system according to claim 1, wherein:
the first signal has first information representing the measured temperature of the switching element, and the second signal has second information representing the result of the determination, and
an amount of the second information in the second signal is smaller than an amount of the first information in the first signal.

3. The driving system according to claim 1, wherein:
the state determining module is configured to output, as the second signal, a binary signal including, as the result of the determination, one of:
a first logical level representing that the switching element is in the specified temperature state; and
a second logical level representing that the switching element is not in the specified temperature state.

4. The driving system according to claim 1, wherein:
the state determining module is configured to:
determine that the switching element is in the specified temperature state upon the measured temperature of the switching element included in the first signal passing through a threshold temperature, and
output the second signal representing that the switching element is in the specified temperature state as the result of the determination.

5. The driving system according to claim 4, wherein:
the state determiner is configured to:
determine that the switching element is, as the specified temperature state, in a first temperature state in which drive of the switching element need be limited upon the measured temperature of the switching element included in the first signal being higher than the threshold temperature, and
output the second signal representing that the switching element is in the first temperature state as the result of the determination, and
the controller is configured to limit drive of the switching element based on the second signal being transferred thereto via the communication medium, the second signal representing that the switching element is in the first temperature state.

6. The driving system according to claim 5, wherein:
an upper limit of the temperature of the switching element at which the switching element is drivable based on the limitation of drive of the switching element is defined as a specified temperature, and
the threshold temperature is set to be lower than a value, the value being obtained by subtracting, from the specified temperature, a low-temperature error due to an individual variability of the temperature measuring module, the low-temperature error being included in the measured temperature of the switching element at a low-temperature side relative to an actual temperature of the switching element.

7. The driving system according to claim 5, wherein:
the state determiner is configured to:
determine that the switching element is, as the specified temperature state, in the first temperature state upon the measured temperature of the switching element included in the first signal being higher than the threshold temperature,
start outputting the second signal representing that the switching element is in the first temperature state as the result of the determination, and
stop the output of the second signal upon the measured temperature of the switching element included in the first signal being equal to or lower than a predetermined temperature, the predetermined temperature being lower than the threshold temperature, and the controller is configured to continuously limit drive of the switching element during transfer of the second signal, representing that the switching element is in the first temperature state, to the controller via the communication medium.

8. The driving system according to claim 5, wherein:
the threshold temperature is referred to as a first threshold temperature, the driving system further comprising:

a disabling module configured to:

determine whether the measured temperature of the switching element is higher than a second threshold temperature, the second threshold temperature being higher than the first threshold temperature; and disable drive of the switching element upon determination that the measured temperature of the switching element is higher than the second threshold temperature.

9. The driving system according to claim 8, wherein:
the state determining module is configured to:

output a third signal representing that the switching element is in a second temperature state as the result of the determination upon drive of the switching element being disabled by the disabling module, the second temperature state being different from the first temperature state.

10. The driving system according to claim 5, wherein:
the state determining module further comprises:

a fault determining module configured to determine whether there is an open fault in the driving system, the open fault affecting on the temperature measuring module, and the fault determining module being configured to:

output a fourth signal representing that the switching element is in a third temperature state as the result of the determination upon determination that there is an open fault in the driving system, the third temperature state being different from the first temperature state.

11. The driving system according to claim 5, wherein:
the switching element is provided in plurality, and the plurality of switching elements constitute a power converter for converting power and transferring converted power between a rotary machine and a DC power source, and the controller is configured to disable the limitation of drive of the switching element upon an external signal indicative of disabling limitation of a controlled variable of the rotary machine being input thereto.

12. The driving system according to claim 4, wherein:
the state determiner is configured to:

determine that the switching element is not in the specified temperature state upon the measured temperature of the switching element included in the first signal being equal to or lower than the threshold temperature, output, as the second signal, a first duty signal having alternate first and second logical levels in sequence as the result of the determination, determine, as the specified temperature state, in a first temperature state in which drive of the switching element need be limited upon the measured temperature of the switching element included in the first signal being higher than the threshold temperature, and output, as the second signal, a second duty signal having a fixed logical level as the result of the determination, and the communication medium is configured such that the second duty signal is transferred therethrough to be input to the controller upon there being an open fault in a signal path from the state determining module to the controller via the communication medium.

13. The driving system according to claim 1, wherein:
the temperature measuring module is equipped with a temperature-sensitive diode located to be close to the switching element and sensitive to the temperature of the switching element.

14. The driving system according to claim 1, wherein:
the temperature measuring module is equipped with a temperature-sensitive diode that is sensitive to the temperature of the switching element.

* * * * *